United States Patent [19]

Yerman

[11] Patent Number: 4,829,014

[45] Date of Patent: May 9, 1989

[54] SCREENABLE POWER CHIP MOSAICS, A METHOD FOR FABRICATING LARGE POWER SEMICONDUCTOR CHIPS

[75] Inventor: Alexander J. Yerman, Scotia, N.Y.

[73] Assignee: General Electric Company, Schenectady, N.Y.

[21] Appl. No.: 189,254

[22] Filed: May 2, 1988

[51] Int. Cl.$^4$ ............................................. H01L 21/70
[52] U.S. Cl. ........................................ 437/8; 437/51; 357/45; 364/491
[58] Field of Search ................. 437/51, 8, 40; 357/45; 364/491

[56] References Cited

U.S. PATENT DOCUMENTS

| | | | |
|---|---|---|---|
| 3,634,929 | 1/1972 | Yoshida et al. | 437/51 |
| 3,641,661 | 2/1972 | Canning et al. | 437/8 |
| 3,702,025 | 11/1972 | Archer | 29/574 |
| 3,771,217 | 11/1973 | Hartman | 437/8 |
| 3,795,972 | 3/1974 | Calhoun | 437/8 |
| 3,795,973 | 3/1974 | Calhoun | 437/8 |
| 3,795,974 | 3/1974 | Calhoun | 437/8 |
| 3,795,975 | 3/1974 | Calhoun et al. | 437/8 |
| 3,835,530 | 9/1974 | Kilby | 437/8 |
| 3,839,781 | 10/1974 | Russel | 437/8 |
| 4,701,860 | 10/1987 | Mader | 437/51 |
| 4,778,771 | 10/1988 | Hiki | 437/8 |

FOREIGN PATENT DOCUMENTS

| | | | |
|---|---|---|---|
| 1444193 | 7/1976 | United Kingdom | 437/8 |
| 8202603 | 8/1982 | World Int. Prop. O. | 437/8 |

OTHER PUBLICATIONS

M. Canning et al., "Active Memory Calls for Discretion", *Electronics*, Feb. 20, 1967, pp. 143-154.

A. J. Yerman et al., U.S. Pat. Appl. No. 947,151, Filed 12-29-86.

V. A. K. Temple, U.S. Pat. Appl. No. 179,441, Filed on 4-8-88.

*Primary Examiner*—Brian E. Hearn
*Assistant Examiner*—Tom Thomas
*Attorney, Agent, or Firm*—Marvin Snyder; James C. Davis, Jr.

[57] ABSTRACT

An additive process allowing discretionary interconnection of only the acceptable devices on a semiconductor wafer includes screen printing a polyimide layer over the wafer to form vias over all of the device contact pads on the wafer while coating the remainder of the wafer. The devices are then individually tested through the vias and, when a device is determined to be unacceptable according to predetermined specifications, the vias above that device are filled with polyimide. A layer of metal is next deposited over the entire wafer by evaporation and makes electrical contact with only the acceptable devices since the unacceptable devices have been blocked off. The metal layer is thereafter patterned to leave an interconnection pattern wherein only the acceptable devices on the wafer are electrically connected.

11 Claims, 5 Drawing Sheets

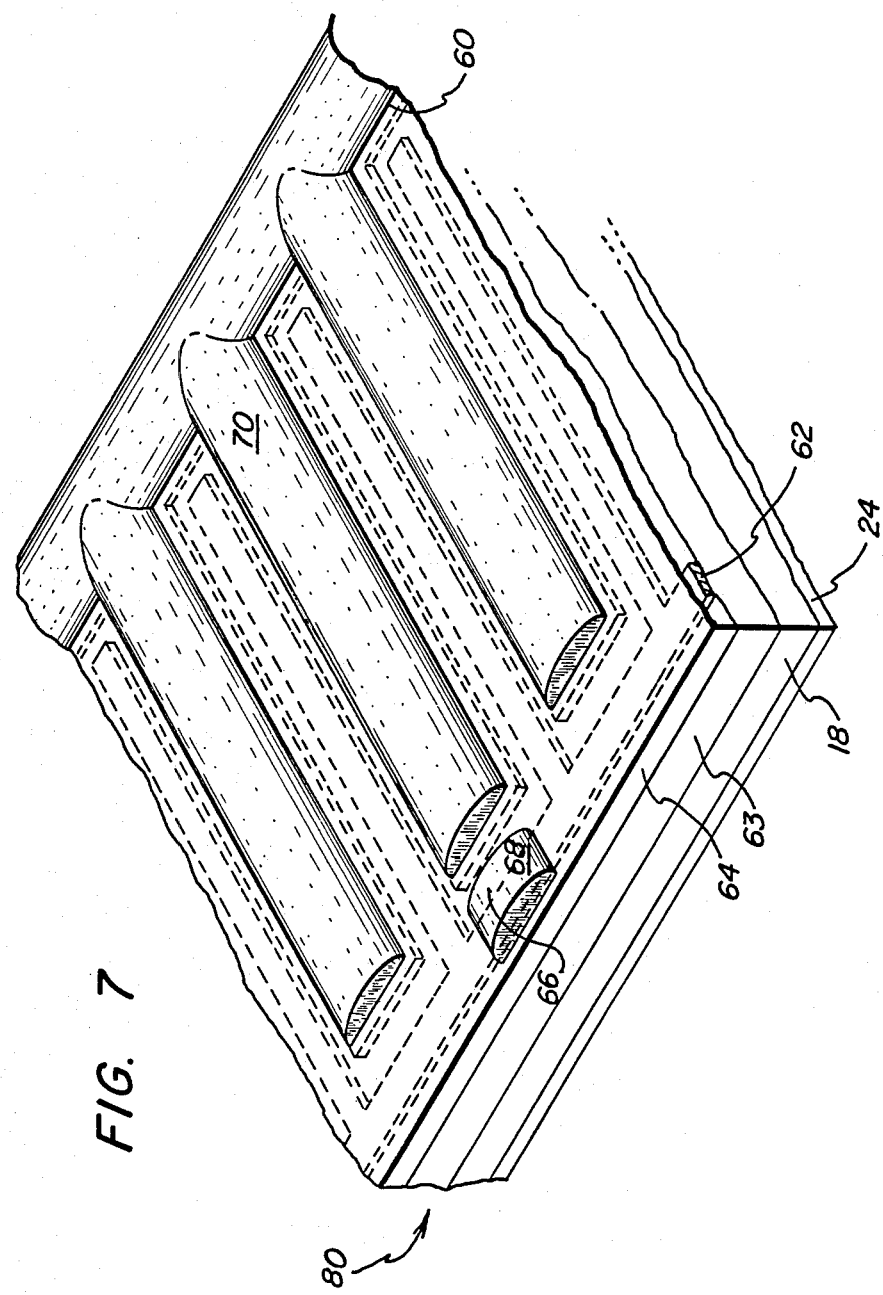

SCREENABLE POWER CHIP MOSAICS, A METHOD FOR FABRICATING LARGE POWER SEMICONDUCTOR CHIPS

CROSS-REFERENCE TO RELATED APPLICATIONS

This application is related to the following co-pending application which is assigned to the instant assignee and is incorporated herein by reference:

"Fabrication of Large Power Semiconductor Composite by Wafer Interconnection of Individual Devices", Ser. No. 06/947,151 filed Dec. 29, 1986 by A. J. Yerman et al. and assigned to General Electric Company.

BACKGROUND OF THE INVENTION

1. Field of the Invention

This invention relates to a discretionary process for interconnecting semiconductor devices formed on a single wafer and, more particularly, to an additive process which differentiates acceptable devices from unacceptable devices on the wafer and permits only the acceptable devices to be interconnected.

2. Description of the Prior Art

In "Active Memory Calls for Discretion", by Canning et al., *Electronics*, Feb. 20, 1967, pp. 143 to 154, a discretionary wiring approach which assures high yield in 1600-bit memory slices is disclosed. In discretionary wiring, each cell is tested prior to interconnection, and only the "good" or acceptable circuits are used in the final array. "Good" and "bad" (i.e., unacceptable) cells on the slice are determined by an automatically stepped multipoint probe controlled by a computer. This test information is stored on tape for later processing by a high speed central computer. A unique discretionary interconnection pattern is determined by the computer utilizing the test data. The pattern bypasses defective cells on the slice. The pattern is input into a multilevel interconnection generator (MIG) in which a computer controlled cathode ray tube beam generates the required pattern on film forming a mask. The mask is then used to form the interconnection pattern.

U.S. Pat. No. 3,702,025 to Archer discloses a simplified discretionary interconnection process wherein numerous identical or similar cells are formed into a continuous chain of such cells on a single semiconductor wafer. The cells are catalogued as either "good" or "bad" cells using a test probe and recording means. The cells are then covered with a dielectric layer and a second layer connection pattern is formed. Connections are made to contacts on the "good" cells only with the connection pattern skipping across defective cells. The invention is not usable where there is no systematic connection of chains of cells.

In the cross-referenced patent application, a plurality of substantially identical semiconductor devices are formed on a single wafer. The devices are individually tested and categorized as acceptable or unacceptable depending on preselected parameters. Only the acceptable devices are coupled together in parallel to form a parallel array. This is accomplished by a process which involved overcoating the device contact with a suitable insulating coating, such as two spin-coated dielectric layers, selectively forming openings through the insulating coating using laser drilling to the pads of the acceptable devices, and depositing a metallization layer over the coating and through the openings to contact the pads of acceptable devices. The metallization layer is then patterned to form separate conductive runs, one for each set of similar contact pads on the devices, each set of contact pads corresponding to a different active semiconductor region of each device. A preselected number of arrays are coupled in parallel to form a mosaic having the desired power rating. The cross-referenced application relates to a subtractive process in that an overlying layer of polyimide is ablated with a laser where a contact via is to be formed for interconnection of active cells.

The prior art does not teach an additive process for fabricating large power semiconductor chips. Subtractive processes require more vias to be serviced than additive processes in that the majority of devices on a wafer are acceptable, and therefore laser drilling is required to form vias to the contact pads of a majority of devices.

SUMMARY OF THE INVENTION

It is therefore an object of this invention to provide a method of fabricating a power chip mosaic using an additive process.

It is another object of this invention to provide a method of forming vias to the contact pads of each semiconductor device on a wafer and then selectively blocking off the vias of only the unacceptable semiconductor devices.

Briefly, in accordance with a preferred embodiment of the invention, a repetitive pattern of power devices such as low power metal oxide semiconductor field effect transistor (MOSFET) devices or MOS controlled thyristors (MCTs) are formed on a single wafer. A polyimide paste is screen printed over the top surface of the semiconductor wafer using a screen pattern that leaves an open area (via) at each gate and source pad while coating the remainder of the surface. The screened polyimide pattern is then cured. The devices are thereafter tested using an automatic wafer prober to differentiate the acceptable devices from the unacceptable devices in terms of preselected operational parameters. A data file is generated on a magnetic disk which contains a map of the unacceptable device locations relative to one or more reference locations on the wafer. Using the map thus generated and a computer controlled X-Y table, the wafer is positioned so that small droplets of additional polyimide can be dispensed to close off the via holes of all defective devices on the wafer. The added polyimide is then cured.

Existing equipment can be modified for sequentially performing the steps of testing a semiconductor device and then filling the via if the device is defective. This is accomplished by providing, on the wafer test probe, an appropriate dispensing system which lags behind the probing operation by one or more cells. A backsputtering operation is then performed to clean up any organic films which may be present on the metal contact pads at the open vias. The wafer is next divided into a plurality of separate areas, each area containing a plurality of adjacent devices, some of the areas including unacceptable devices along with acceptable devices. While the areas of the wafer may be designated prior to testing, it is preferable to do so after testing in order to maximizing yield. An appropriate metallization is deposited over the top surface of the wafer, covering the polyimide layer and contacting the pads of the acceptable devices. The filled vias serve to block the metallization from contacting the pads of the unacceptable devices. Chrome-copper metallization is suitable, although other metals are appropriate, with the choice guided by the desirability of having a solderable top metal layer. A photoresist layer is then spun on over the metal layer and patterned with a mask to provide scribe lanes for the power chip mosaic chip arrays and to remove metallization connecting the gate and source structures for each array so as to provide the structures with electrical separation. For MOSFET devices, separate conductive runs making contact respectively to the source and gate active areas on acceptable devices are made. Metallization over the gate and source pads may be plated up with additional metal thickness to achieve a thickness suitable for soldering. The photoresist is then stripped and the upper layer metal is etched slightly. An upper layer polyimide is applied and patterned such that the gate bus is covered, except for a central contact region, and the source bus is left exposed. Solder is then placed up on the exposed regions. Each array is subsequently tested and defective arrays are discarded. Finally, depending on the desired power rating of a composite device to be formed, a preselected number of arrays are coupled in parallel to form a mosaic which includes a ceramic heat sink for each array.

BRIEF DESCRIPTION OF THE DRAWINGS

The foregoing and other objects, aspects and advantages of the invention will be best understood by reference to the following detailed description of the invention taken in conjunction with the accompanying drawings, in which:

FIG. 7 is a perspective view of a portion of an interconnected array of chips prior to assembly onto a heat sink mounting.

DETAILED DESCRIPTION OF THE PREFERRED EMBODIMENT OF THE INVENTION

Figure 1:
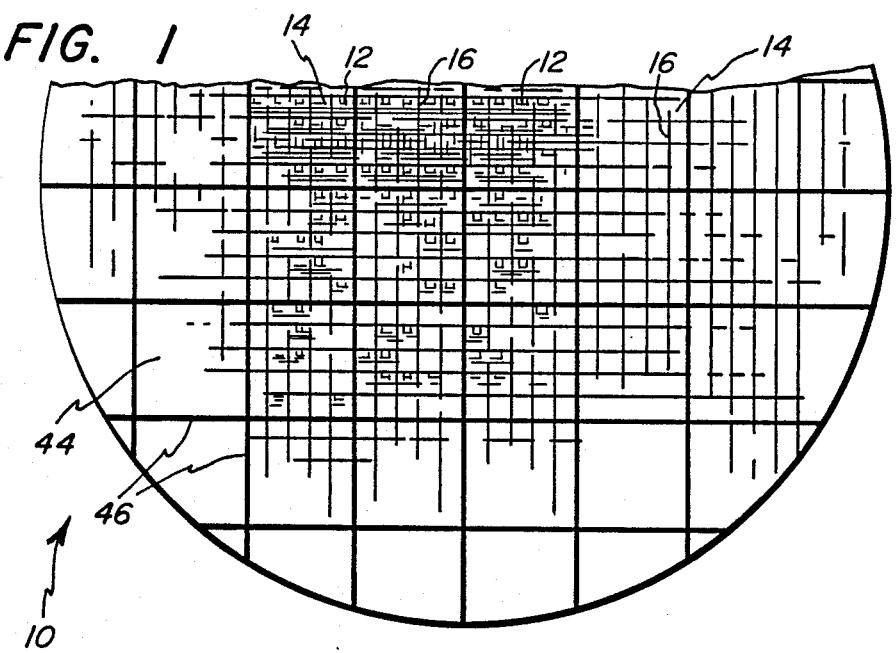
FIG. 1 is a top view of a semiconductor wafer with individual semiconductor chips or devices formed thereon, the wafer shown as divided into a plurality of areas (defined by dark grid lines), each area containing a plurality of adjacent chips to be interconnected into an array.
Figure 2:
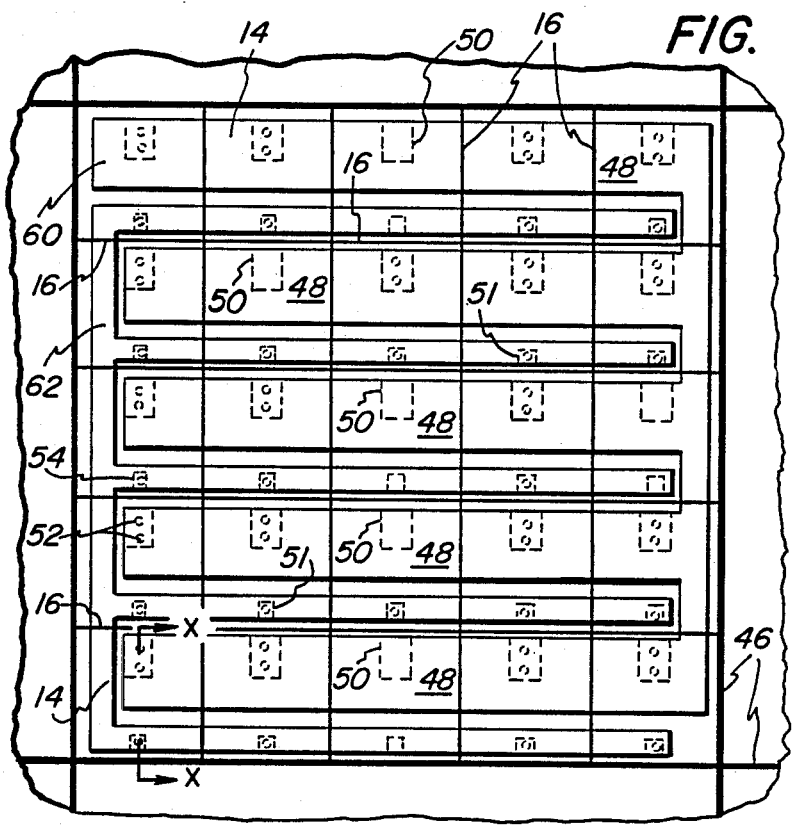
FIG. 2 is a more detailed view of one of the arrays on the wafer of FIG. 1.
Figure 3:
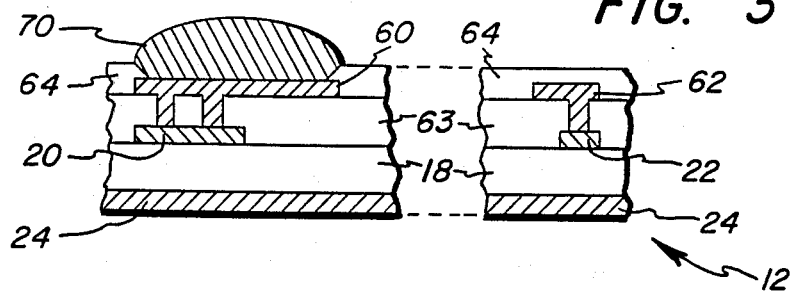
FIG. 3 is a cross-sectional view taken along line X—X of FIG. 2 showing one of the semiconductor devices on the wafer.

FIGS. 1, 2 and 3 show a conventional fabricated semiconductor wafer to which the process of the invention is to be applied. In FIG. 1, a portion of a typical semiconductor wafer 10 comprising a plurality of semiconductor devices such as MOSFETs 12 is shown. Each individual MOSFET 12 is located within a square-shaped zone 14 defined by light grid lines 16 in FIGS. 1 and 2, it being understood that light grid lines 16 are shown only for ease of illustration and do not appear on the wafer itself. MOSFET devices 12 are formed throughout substantially the entire wafer 10 notwithstanding that only a small fraction are shown in FIG. 1.

Each of MOSFET devices 12, such as shown in FIG. 3, is formed in a processed silicon substrate 18 in conventional manner. Each such device comprises a first contact pad 20 contacting a first active semiconductor region within substrate 18 and commonly designated as the source pad, and a second contact pad 22 overlying a second active semiconductor region within substrate 18, commonly designated as the gate pad. Source and gate pads 20 and 22, respectively, are shown as being located on the upper planar surface of substrate 18, while a third contact pad 24 is located adjacent a third active semiconductor region within substrate 18 and is commonly designated as the drain pad, located on the lower planar surface of substrate 18. Pads 20, 22, and 24 are usually made of aluminum. While FIG. 3, for ease of understanding, illustrates only conductive pads 20, 22, and 24 associated with the underlying structure of semiconductor substrate 18, the substrate and associated pads usually comprise a much more complex structure.

As is well known in the art, the yield from conventional processes for fabricating MOSFETs (and other types of devices) on a semiconductor wafer is invariably less than 100%. Thus, on a typical wafer, a number of MOSFET devices 12 will be unacceptable because they do not meet one or more required specifications. A semiconductor chip which incorporates non-functioning individual devices will not operate properly. Therefore, the additive process provides a means for eliminating such unacceptable devices from the interconnected devices in the chip mosaic.

Figure 4:
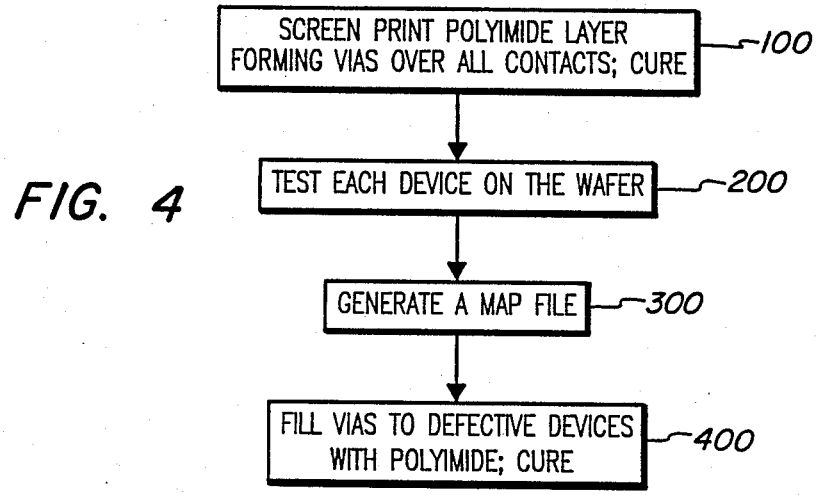
FIG. 4 is a flowchart showing the steps for forming vias over acceptable semiconductor devices by an additive process.

FIG. 4 is a flow chart showing the steps performed in the inventive additive process. Starting with a previously-fabricated semiconductor wafer which comprises a plurality of substantially identical semiconductor power devices, as generally shown and described in conjunction with FIGS. 1, 2, and 3, the first step 100 is to screen print polyimide paste over the top surface of the wafer using a screen pattern that leaves an open area at each gate and source pad while coating the remainder of the surface. A polyimide designed for screen printing on silicon wafers is available from Epoxy Technology, Inc., of Billerica, Mass. and sold as Epo-Tek 600. The formulation is a thixotropic mixture of polyimide with a fumed silica and other synthetic fillers in a low volatility solvent system. It has been employed primarily as moisture protection and scratch protection for fine line metallization. It can be screen printed with a pattern resolution of approximately 5 mils. The polyimide coating is then cured to hardness.

In step 200, each of the devices on the wafer is tested with a wafer prober in order to determine whether the device is acceptable or unacceptable from an operational standpoint. From the results of the test probe, an X-Y grid positional map file which locates the defective devices relative to one or more reference locations on the wafer is generated in step 300. This file may be stored on a magnetic disk.

In step 400, the wafer is mounted on a computer controlled X-Y table and, using the map generated in step 300, the wafer is positioned so that small droplets of additional polyimide can be dispensed to close off the via holes of all defective devices on the wafer. The added polyimide may be the same as that used when screen printing, or may comprise any other suitable polyimide. The added polyimide material merely serves to plug the via over the unacceptable device. The added polyimide is then cured to hardness. The wafer resulting from the above procedures has a polyimide surface layer with vias open to only the acceptable semiconductor devices on the wafer.

The process thus outlined in FIG. 4 is additive in that polyimide is added to the vias of defective devices, as opposed to the subtractive process disclosed in the cross-referenced application where a layer of polyimide coats the entire wafer and the vias are individually drilled to each acceptable device. The additive process has the advantage of being a lower cost process since a screened-on dielectric layer can be produced at lower labor cost than a spun-on double layer of dielectric. In addition, on a typical commercial wafer, the majority of devices are acceptable, so that the number of devices needing to be blocked off using the additive process is less than the number of devices requiring vias which would need to be drilled using the subtractive process. As a variation on the above described additive process, the testing of semiconductor devices and filling of vias over defective devices can be performed sequentially on the same piece of processing equipment by providing an appropriate dispensing system on the wafer prober. The filling operation can lag behind the probing operation by one or more cell locations.

Figure 5:
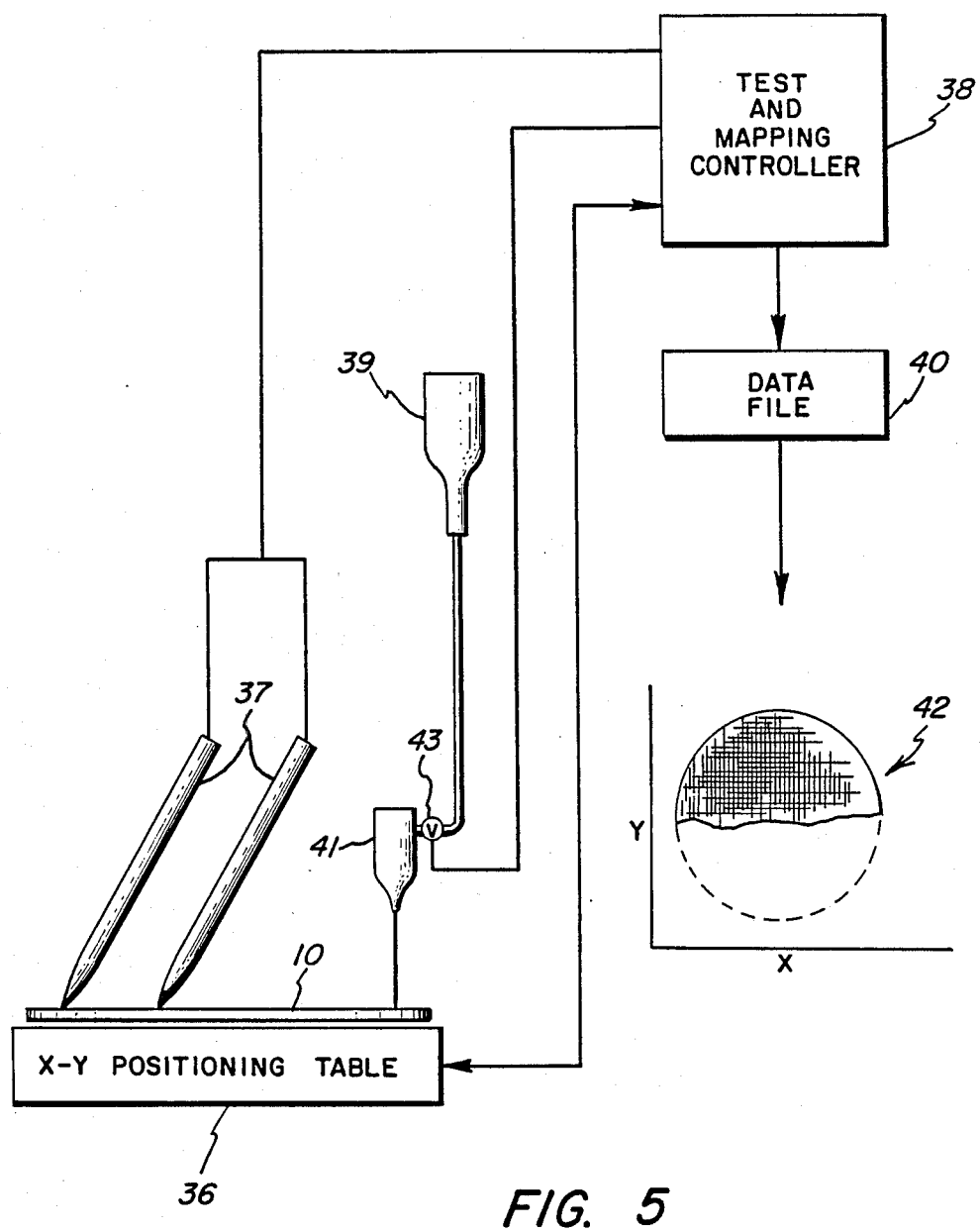
FIG. 5 is a block diagram of apparatus used for testing each of the devices, mapping the location of the devices, and filling the vias above the defective devices.

FIG. 5 illustrates the essential parts of an arrangement whereby the acceptable and unacceptable devices on wafer 10 can be determined. Wafer 10 is placed on an X-Y positioning table 36 such that the wafer can be moved under control of a test and mapping controller 38 in a manner which allows a suitable probe set 37 or other testing device to investigate the wafer 10 surface, specifically, each MOSFET formed on wafer 10. The results of the testing are analyzed by controller 38 to generate a data file 40 comprising a positional X-Y mapping which delineates the acceptable devices from the unacceptable devices. Data file 40 is typically in the form of an array of values stored in the computer memory or on a suitable storage medium. A graphical map 42 can then be generated from data file 40. One piece of equipment which may be used to accomplish the above noted testing purpose is a combination of the "Impact II Automated Discrete Semiconductor Test System" manufactured by the Eaton Corporation, of Danbury, Conn. and a "Model Probe II" manufactured by Pacific Western Systems, Inc. of Mountainview, Calif. This system permits the mounting of a wafer on a translatable table while probes on the equipment sequentially interrogate each of the individual devices on the wafer to determine whether the device is acceptable in accordance with defined standards programmed into the testing equipment. The system generates software data file 40 and graphical mapping 42 of the results. Dispenser 39 contains a supply of polyimide to fill the vias over unacceptable devices on the wafer. This step is performed by momentarily opening a valve 43 in response to a signal from controller 38. Droplets of polyimide are thus passed through valve 43 from dispenser 39 and are deposited in the vias by a nozzle 41 which lags behind probe set 37 by one or more cell locations.

Figure 6:
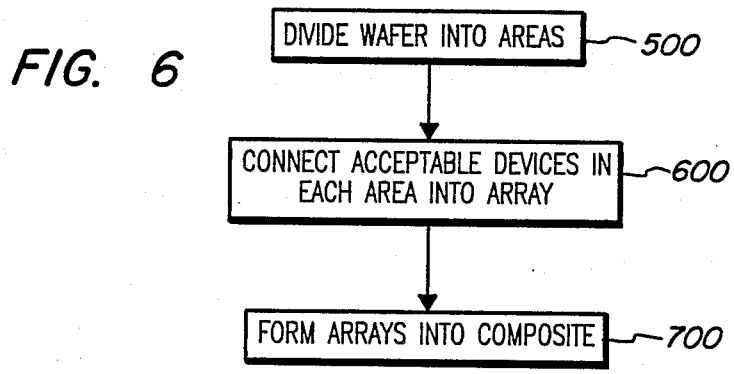
FIG. 6 is a flowchart showing the steps for forming power chip composites from a wafer with a dielectric coating and open vias over only the acceptable devices on the wafer surface.

FIG. 6 outlines the steps required for forming power chip composites. The wafer is divided into a plurality of areas, as indicated at step 500, each area containing a plurality of adjacent individual semiconductor devices. These areas may be designated prior to testing or after testing, although it is preferable to do so after testing in order to maximize utilization of acceptable devices in forming the composite. The areas may be selected without reference to whether devices contained therein are acceptable or unacceptable. FIG. 1 shows areas 44 bounded by relatively heavy grid lines 46. Areas 44 each contain a plurality of adjacent semiconductor devices 12, each device being located in the smaller zones 14 outlined by the relatively lighter grid lines 16. The size of areas 44 and the number of devices 12 within each such area is determined in accordance with the electrical rating of the individual devices 12 and the desired rating of the resultant composite packages to be fabricated. For example, if each device is rated at 1 amp and a 25-30 amp composite device is considered commercially appropriate, a 5×5 device area 44 (as shown in FIG. 2) would be a reasonable choice. The packaging designs possible with these solderable structures generally permit higher unit current than the rated value due to the relatively low thermal resistance of the structures.

FIG. 2 shows six unacceptable chips 48 with no vias open to their associated contact pads 50. The showing of two open contact vias 52 for the source contact is primarily to allow better differentiation between source vias 52 and gate vias 54 in the drawing. The number of vias overlying a given contact pad is a matter of discretion depending in part on the current to be carried by the source region. In addition, while the vias in the screened polyimide film are shown in the form of cylinders, in actuality such precise shapes are seldom achievable and irregular shapes are to be assumed.

Referring again to FIG. 6, the next step 600 is to connect the acceptable devices in each area into an array. A backsputtering operation is performed to clean up any organic films on the metal contacts at the open vias. Then a continuous metal film is evaporated over the surface of the wafer. The metal film contacts the source and gate electrodes of each of the acceptable devices on the wafer through the open vias. The metal film lies on top of the polyimide coating and thus is prevented from contacting the unacceptable devices which have been blocked by the added polyimide. A typical film comprises 300-500 Angstroms thickness of chromium (Cr) overcoated with a one micron thickness of copper (Cu). If thicker metal is desired, it can be applied at this stage by electroplating. The metal layer is then patterned to electrically separate the gate and source structures for each array and to provide scribe lanes for the power chip mosaic chip arrays. This is accomplished by spinning on photoresist over the metal layer and patterning it photolithographically with a mask, and then removing the metal. FIGS. 1, 2, and 3 illustrate the metal pattern formed. Each area 44 is isolated by removing the metal above the heavy grid lines 46 which are the scribe lanes for the chip arrays. A first conductive run 60 connects all the source pads of acceptable devices while a second conductive run 62 connects all the gate pads of acceptable devices. Both conductive runs 60 and 62 resemble a set of fingers coupled together by a base run, with the fingers being interdigitated. The above described patterning of the metal film is considered to be conventional. Note from FIG. 3 that metal in conductive runs 60 and 62 fills the vias in screened polyimide layer 63 to make electrical contact with underlying pads 20 and 22.

At this stage of the process, the upper surface of the wafer in each of areas 44 includes two interdigitated conductive runs 60 and 62. For ease of later assembly, it is desirable to provide a single small area contact as an electrical connection to gate run 62 since the current carried by the gate during normal operation of the resultant device is very small. Conversely, the current carried by source run 60 is relatively large, so that the contact area must be large. FIG. 7 illustrates the end product for this contact formation. A second layer of polyimide 64 is applied over patterned conductive runs 60 and 62. This layer is not imidized, but is only heated sufficiently to remove the bulk of the solvent. By applying a positive photoresist (not shown) over it, and exposing the photoresist through a second fixed mask, this second polyimide layer 64 is etched away by a positive photoresist developer where the photoresist has been removed, leaving the second polyimide layer 64 completely covering gate run 62, except in a small central area 66 on the periphery of each area 44, and leaving source run 60 completely exposed from above. Following the polyimide patterning step, the polyimide layer is cured by heating. The positive photoresist process is conventionally used in patterning polyimides and, therefore, no additional details are deemed necessary here. An acceptable alternative to the positive photoresist process is to use a photosensitive polyimide (such as Hitachi PL-1100, available from Hitachi Chemical Co. of America, Ltd., New York, N.Y.) that can be patterned using conventional photolithographic techniques.

After the second polyimide layer is patterned and cured, a conventional solder process is employed to provide external contact surfaces 68 and 70 to gate and source electrodes, respectively, in each area 44. The additional metal thickness should be plated up to achieve a metal thickness suitable for soldering. FIG. 3 shows only external contact surface 70 because FIG. 3 is a cross-sectional view of the wafer in the direction of the arrows along line X—X on FIG. 2 and external contact surface 68 is not present in this viewing direction.

Referring again to FIG. 6, the last step 700 is to form arrays into composite packages. The number of arrays coupled together to form the composite is essentially dictated by the desired power rating for the composite. At this stage, wafer 10 is severed along scribe lines 46 to provide a plurality of arrays 80 approximately 0.5 inches on a side, each of which contains a 5×5 array of smaller chips with only the "good" chips interconnected. Each array 80 corresponds to the area 44 from which it was formed, and FIG. 7 shows the central portion of one array 80. Each of these arrays has a solderable source contact 70, which extends over much of the array surface, and a solderable gate contact 68 at the array edge.

Figure 8:
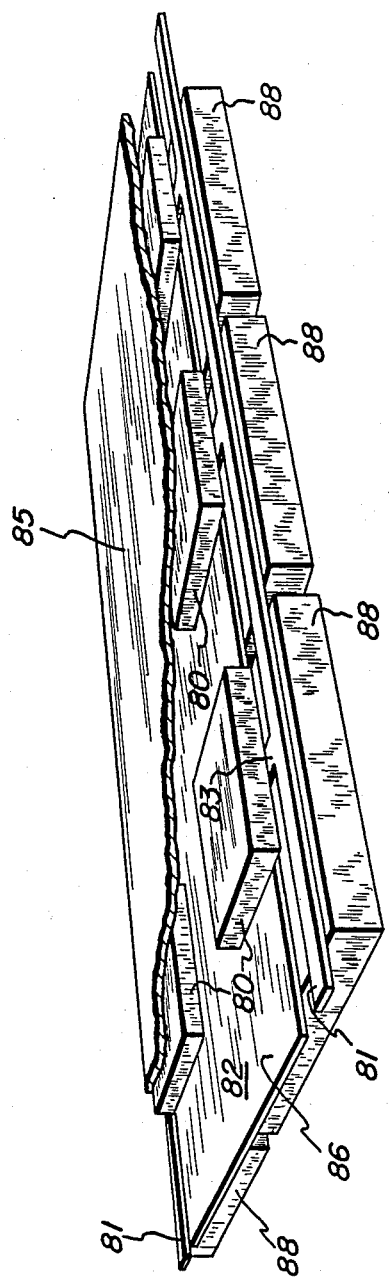
FIG. 8 is a partially cut-away, perspective view showing the assembly of a plurality of arrays to form a composite device fabricated in accordance with the invention.

FIG. 8 illustrates a heat sink support made by direct bonding a thin foil of copper or copper-surfaced metal 82 to a series of dielectric ceramic blocks 88. Continuous foil 82 is bonded to ceramic blocks 88 by the procedure set forth in the patents of Burgess et al. (U.S. Pat. No. 3,744,120), Babcock et al. (U.S. Pat. No. 3,766,634), Burgess et al. (U.S. Pat. No. 3,854,892), Burgess et al. (U.S. Pat. No. 3,911,553), Cusano et al. (U.S. Pat. No. 3,994,430) or Cusano et al. (U.S. Pat. No. 4,129,243), all of which are assigned to the instant assignee. Copper foil 82 binds ceramic blocks 88 together to form a unitary assembly. Either prior to bonding, or after bonding, the foil is chemically etched in a conventional manner to form electrically separate patterns 81 and 86. Outer pattern 81 makes electrical contact with the gate electrode in a given array 80. The gate electrodes in several arrays 80 may be connected by the outer pattern 81 contacting the gate solder contact, which is located at the periphery of each array 81, by a finger projection 83. As shown in FIG. 8, two rows of arrays 80 positioned on opposite regions of foil 82 can have the gate electrodes of each array connected by a pair of outer patterns 81. In similar fashion, a second but larger area, rectangular inner copper pattern 86, is provided for interconnecting the source electrodes of arrays 80 via the large area source solder contact.

Arrays 80 are next connected to the preassembled heat sink support assembly. This may be accomplished by suitable flip-chip techniques whereby gate solder contact 68 is electrically coupled to outer foil pattern 81 by finger projection 83 and source solder surface 70 is electrically coupled to inner foil pattern 86. Once the arrays have been mounted on the heat sink support, the arrays may be tested individually or collectively by applying a temporary contact to the exposed drain contact which, in FIGS. 3 and 8, is the top of the assembly. Testing insures that all mounted chips are still fully functional. If some are not, they can be readily cut out at this stage by cutting the copper foil bridges which join the mosaic of ceramic pieces. In general, hoever, one would expect to have a very high yield at the end of this mounting operation. Following this test, a permanent drain contact is created by soldering a copper pattern 85 across drain electrodes 24 (shown in FIGS. 3 and 7) of all arrays 80.

One particular advantage of the two-tier mosaic is that arrays 80 are separated far enough apart that, when in operation, heat spreading results in lower thermal resistance. At the same time, the ceramic mosaic provides ground insulation for the entire array. Typically, the exposed surfaces of the ceramic blocks are metallized so that the entire array can be soldered to a larger heat sink. By employing a ceramic mosaic heat sink instead of a single large piece, benefits accrue in the form of longer thermal fatigue life and a significant reduction in cost of the ceramic if beryllium oxide (BeO) is used.

While the invention has been described in terms of the preferred embodiment which contemplates a particular polyimide that is screen printed such that vias are formed over all the contacts on an array and then the unacceptable devices are blocked off by filling those particular vias with a polyimide, it is intended that modifications of the polymer compounds employed are contemplated within the spirit and scope of the appended claims. Other modifications and changes will occur to those skilled in the art. It is, therefore, to be understood that the appended claims are intended to cover all such modifications and changes as fall within the true spirit of the invention.

Having thus described my invention, what I claim as new and desire to secure by Letters Patent is set forth in the following claims:

1. An additive process for discretionary interconnection of acceptable devices on a semiconductor wafer which contains a plurality of acceptable and unacceptable devices, comprising the steps of:

screen printing a polymeric layer on said semiconductor wafer such that vias are formed over each of said plurality of devices, said vias exposing contact pads for each of said plurality of devices;

testing each of said plurality of devices to distinguish acceptable devices from unacceptable devices according to predetermined parameters;

generating a positional map identifying the unacceptable device positions on said surface of said semiconductor wafer;

selectively blocking off said unacceptable devices in accordance with said map by filling only the vias exposing the contact pads of said unacceptable devices;

coating said semiconductor wafer with a layer of metal so as to electrically interconnect the acceptable devices on said semiconductor wafer; and patterning said metal layer to form a power chip array wherein at least some of said acceptable devices are interconnected by metal conductive runs.

2. An additive process as set forth in claim 1 wherein said screen printing is performed utilizing a thixotropic mixture of polyimide and fumed silica.

3. An additive process as set forth in claim 2 wherein each of said acceptable devices includes a source contact pad and a gate contact pad, and wherein the step of patterning said metal layer comprises forming a first conductive run to interconnect a plurality of source contact pads of said acceptable devices and a second conductive run to interconnect a plurality of gate contact pads of said acceptable devices, said first and second conductive runs being electrically isolated from each other.

4. An additive process as set forth in claim 3 wherein the step of coating said wafer with a layer of metal comprises metallizing said wafer with a chrome-copper metallization.

5. An additive process as set forth in claim 1 wherein the step of selectively blocking off said unacceptable devices comprises dispensing a droplet of polyimide into a via above each of said unacceptable devices.

6. An additive process for discretionary interconnection of acceptable devices on a semiconductor wafer which contains a plurality of acceptable and unacceptable devices, comprising the steps of:

screen printing a polymeric layer on said semiconductor wafer such that vias are formed over each of said plurality of devices, said vias exposing contact pads for each of said plurality of devices;

moving a computer controlled wafer prober sequentially to each of said vias to distinguish acceptable devices from unacceptable devices according to predetermined parameters;

selectively blocking off said unacceptable devices by filling, from a nozzle lagging behind said wafer prober by one or more vias, only the vias exposing the contact pads of said unacceptable devices;

coating said semiconductor wafer with a layer of metal so as to electrically interconnect the acceptable device on said semiconductor wafer; and patterning said metal layer to form a chip array wherein at least some of said acceptable devices are interconnected by metal conductive runs.

7. An additive process as set forth in claim 6 wherein said screen printing is performed utilizing a thixotropic mixture of a polyimide and fumed silica.

8. An additive process as set forth in claim 7 wherein each of said acceptable devices includes a source contact pad and a gate contact pad, and wherein the step of patterning said metal layer comprises forming a first conductive run to interconnect a plurality of source contact pads of said acceptable devices and a second conductive run to interconnect a plurality of gate contact pads of said acceptable devices, said first and second conductive runs being electrically isolated from each other.

9. An additive process as set forth in claim 8 wherein the step of coating said wafer with a layer of metal comprises metallizing said wafer with a chrome-copper metallization.

10. An additive process as set forth in claim 6 wherein the step of selectively blocking off said unacceptable devices comprises dispensing a droplet of polyimide into a via above each of said unacceptable devices.

11. A method for fabricating a power chip mosaic from a plurality of substantially identical semiconductor arrays, each of said arrays comprising a plurality of acceptable and unacceptable devices formed on a common semiconductor wafer, comprising the steps of:

discretionarily interconnecting said acceptable devices in each array by screen printing a polymeric layer on said surface of said semiconductor wafer so as to form vias over each of said plurality of devices, said vias exposing contact pads for each of said plurality of devices, testing each device of said plurality of devices to identify unacceptable devices according to predetermined parameters, generating a positional map to locate said unacceptable devices on said semiconductor wafer, selectively blocking off said unacceptable devices located by said map by filling the vias exposing the contact pads of said unacceptable devices, coating said semiconductor wafer with a layer of metal to electrically interconnect the acceptable devices on said semiconductor wafer, patterning said metal layer to form a power chip array wherein a plurality of source contact pads of said acceptable devices are interconnected by a first conductive run and a plurality of gate contact pads of said acceptable devices are interconnected by a second conductive run, said first and second conductive runs being electrically isolated from each other;

dividing said wafer into said plurality of arrays;

coupling together in electrical parallel said first conductive run and said second conductive run of at least selected ones of said plurality of arrays utilizing strips of conductive foil;

supporting said selected ones of said plurality of arrays on a support substrate comprising a mosaic of ceramic blocks connected by said strips of conductive foil; and applying a drain contact to said selected ones of said plurality of arrays to interconnect a drain portion of each of said devices in said array.

* * * * *